United States Patent [19]

Yoshikawa et al.

[11] Patent Number: 4,712,000

[45] Date of Patent: Dec. 8, 1987

[54] ROTARY ENCODER WITH SOURCE-ADJACENT LIGHT SAMPLING AND CONTROL

[75] Inventors: Junichi Yoshikawa; Masahiro Rachi, both of Tokyo, Japan

[73] Assignee: Canon Kabushiki Kaisha, Tokyo, Japan

[21] Appl. No.: 661,822

[22] Filed: Oct. 17, 1984

[30] Foreign Application Priority Data

| Oct. 21, 1983 | [JP] | Japan | 58-196178 |
| Oct. 21, 1983 | [JP] | Japan | 58-196179 |
| Feb. 23, 1984 | [JP] | Japan | 59-31505 |
| Feb. 23, 1984 | [JP] | Japan | 59-31506 |
| Mar. 23, 1984 | [JP] | Japan | 59-54507 |
| Mar. 23, 1984 | [JP] | Japan | 59-54508 |

[51] Int. Cl.[4] .............................................. G01V 1/32
[52] U.S. Cl. .............................. 250/205; 250/231 SE
[58] Field of Search ............. 250/205, 231 SE, 237 G; 356/395; 340/347 P

[56] References Cited

U.S. PATENT DOCUMENTS

| 3,469,101 | 9/1969 | Rabian et al. ........................ 250/205 |
| 4,040,740 | 8/1977 | Handtmann et al. ................ 250/205 |
| 4,047,585 | 9/1977 | Dlugos ................................ 250/237 G |
| 4,074,128 | 2/1978 | Harris et al. ..................... 250/231 SE |
| 4,118,129 | 10/1978 | Grundherr .......................... 250/205 |
| 4,326,128 | 4/1982 | Klein .............................. 250/237 G |
| 4,556,792 | 12/1985 | Kano et al. . |

*Primary Examiner*—David C. Nelms
*Attorney, Agent, or Firm*—Fitzpatrick, Cella, Harper & Scinto

[57] ABSTRACT

A rotary encoder comprises a light emitting device, a photosensor, sampling means arranged between the light emitting device and the photosensor for intercepting the light emitted by the light emitting device as the sampling means is rotated, monitoring means arranged on a side of the sampling means facing the light emitting device in adjacent to the light emitting device for sensing a portion of the light from the light emitting device and producing a signal representing a light intensity sensed, and control means for controlling the light intensity of the light emitting device in accordance with the output of the monitoring means.

6 Claims, 17 Drawing Figures

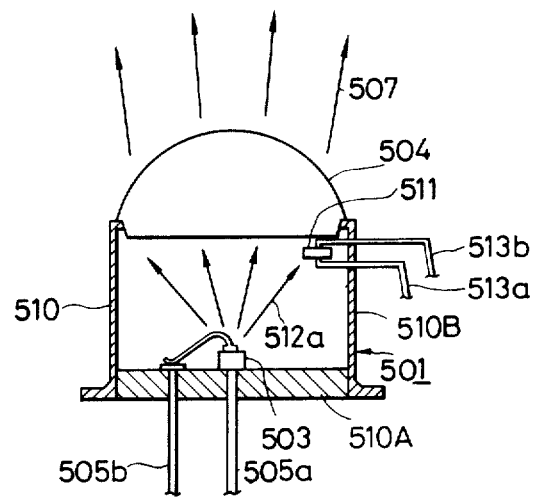
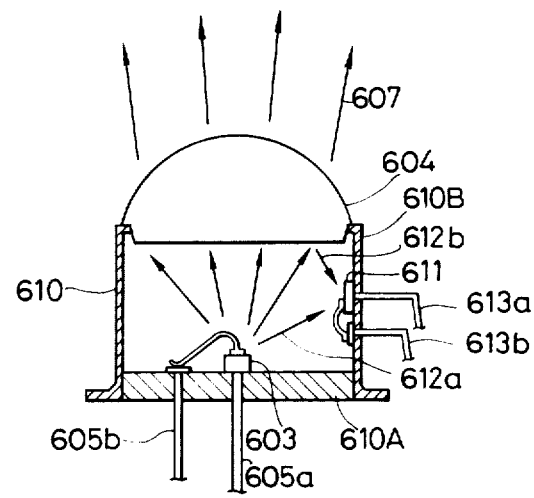

ROTARY ENCODER WITH SOURCE-ADJACENT LIGHT SAMPLING AND CONTROL

BACKGROUND OF THE INVENTION

1. Field of the Invention

The present invention relates to an optical rotary encoder used to control a speed of a rotary machine or a rotation position, and more particularly to a rotary encoder having a photosensor for compensating a variation in an output of a light emitting device.

2. Description of the Prior Art

FIGS. 1, 2 and 3 show one example of a conventional optical rotary encoder. Numeral 1 denotes a rotating slit disc mounted on a rotating shaft 2. As shown in FIG. 2, the disc 1 has one slit 1A and a number of slits 1B formed along a periphery thereof. A stationary slit plate 3 arranged to oppose to the periphery of the disc 1 has stationary slits 3A, 3B and 3C formed at overlapping positions to the slits 1A and 1B. (See FIG. 3). As is well known, the slit 1A is used to detect a home position in each revolution and the slits 1B are used to detect, for example, type positions.

Numeral 4 denotes a light emitting device and numeral 5 denotes a plurality of photosensors. As the disc 1 is rotated, each time the slits 1A or 1B overlap the stationary slits 3A, 3B and 3C, the light from the light emitting device 4 passes through the slits 1A or 1B and the slits 3A, 3B and 3C and impinges to the photosensors 5. A change in the intensity of light sensed is converted to an electrical signal so that a control is made in accordance with the output signal.

As shown in FIGS. 2 and 3, the photosensors 5 include a monitor photosensor 5M whichis arranged at a position where the light from the light emitting device 4 is received without routing the slits 1A and 1B and the slits 3A, 3B and 3C. The light output from the light emitting device 4 is monitored by the monitor photosensor 5M.

Since the output of the light emitting device 4 changes with an environmental temperature or aging, the monitor photosensor 5M is provided to detect the light intensity in order to compensate such a change. Thus, the light output from the light emitting device 4 is controlled by a drive circuit (not shown) for the light emitting device 4 such that the light intensity at the monitor photosensor 5M is always kept constant.

In such a prior art rotary encoder, however, since the light from the light emitting device 4 is reflected by the rotating disc 1 or scattered or disturbed before it is sensed by the photosensor 5M, the sensed light intensity may change in spite of no change in the light output.

In the prior art rotary encoder, the slit 1A is formed in the rotary slit disc 1 by vapordepositing a metal film on one side of a glass plate except the slit area. A certain degree of decentering at a periphery of the disc 1 is usually admitted because high precision of coaxiality between the slit pattern and the periphery of the disc 1 would lead to the increase of cost.

Because of the decentering of the periphery, the light from the light emitting device 4 may be affected during the rotation of the disc 1. As a result, the light intensity sensed by the monitor photosensor 5M may change in spite of no change in the light output.

Thus, the light output apparently changes and the intended purpose of compensating the change in the light output from the light emitting device 4 is damaged and the light output from the light emitting device 4 is unnecessarily changed and a stable control is not attained.

In order to resolve the above problem, it may be possible to arrange the monitor photosensor which senses the light intensity of the light emitting device 4 on the side of the slit disc 1 on which the light emitting device 4 is mounted in such a manner that the light from the light emitting device 4 is directly sensed by the monitor photosensor in order to prevent the light emitted from the light emitting device 4 and sensed by the monitor photosensor from being affected by the rotation of the slit disc 1.

However, the above arrangement does not resolve a problem of affect by external optical noises and variations in the mounting position and direction of the monitor photosensor with respect to the light emitting device 4 affect the light intensity sensed by the monitor photosensor so that an adjustment for compensating the change in the light output is complicated and work amount is increased.

One of factors which significantly affects the characteristic of the output signal is a distance or gap between the rotating slit disc 1 and the stationary index slit 3. The larger the number of slits is, the smaller must be the gap and the more is the affect to the output signal by the change of the gap. Accordingly, in the encoder having a large number of slits, it is necessary to reduce the gap and keep the gap constant.

On the other hand, since the encoder is usually directly coupled to a rotary machine, it is directly subjected to a heat generated by the rotary machine.

An encoder case which has a complex shape is, in many cases, molded in order to prevent cost increase. In this case, because of a difference between coefficients of linear expansion of the rotary shaft 2 of the rotary machine and the encoder case, dimensions in motor thrust direction at a low temperature and a high temperature are different. Thus, the gap substantially changes and the output signal largely varies with the temperature.

In order to reduce the above phenomenon, the thrust dimension of the encoder case may be reduced to lessen the affect by the coefficient of linear expansion. However, the thrust dimension cannot actually be reduced because of the limitation by the size of the light emitting device 4 and the fact that a larger light emitting device offers a more stable optical characteristic. Accordingly, the size of the encoder case cannot also be reduced.

In the past, the monitor photosensor used to maintain the light output from the light source of the optical encoder at a constant level is constructed as a separate part from the light emitting device. Accordingly, the distance between the light emitting device and the photosensor is long, the light intensity sensed by the photosensor is insufficient or the photosensor may sensor an external light accordingly, it is necessary to optically sealed those parts.

Because the light emitting device and the photosensor are separate parts, it is necessary to adjust a distance between those parts and orientation of those parts when they are assembled.

SUMMARY OF THE INVENTION

It is an object of the present invention to provide a rotary encoder in which a monitor photosensor for sensing a light intensity of a light emitting device is arranged on one side of a rotary slit disk on which the light emitting device is mounted to prevent the light intensity emitted by the light emitting device and sensed by the monitor photosensor from being affected by the rotation of the rotary slit disc.

It is another object of the present invention to provide an encoder in which stationary index slits are arranged on one side of a rotary slit disc facing a rotating motor, a light emitting device is arranged on the opposite side of the rortary slit disc, and a dimension in a motor shaft thrust direction of a member for supporting the stationary index slit and the photosensor is minimized so that a change of gap length by a temperature change is suppressed and a stable output signal is produced.

It is other object of the present invention to provide a light source for an optical encoder in which a light emitting device and a photosensor for monitoring a light intensity are properly arranged in one package so that the light intensity sensed by the photosensor is increased and an affect by an external light is eliminated.

It is other object of the present invention to provide a rotary encoder in which a monitor photosensor for compensating a change in output of a light emitting device and the light emitting device are accommodated, in a close relation to each other, in a container arranged on one side of a rotary slit disc, and a light path through which the light from the light emitting device is directly sensed by the monitor photosensor is established in the container in order to prevent the light intensity sensed by the monitor photosensor from being affected by the rotation of the rotary slit disc or an external optical noise or mismatching of mounting position or direction.

It is other object of the present invention to provide a rotary encoder in which a light emitting device and a monitor photosensor for sensing a light intensity of the light emitting device are arranged adjacently with a wall being interposed therebetween in a housing mounted on one side of a rotary slit disc, and a light path is established in the housing such that a portion of light emitted from the light emitting device which is reflected by the disc is sensed by the monitor photosensor to prevent the light intensity sensed by the monitor photosensor from being affected by the rotation of the disc and the mismatching of the mount position and direction.

It is other object of the present invention to provide a rotary encoder in which a monitor photosensor for sensing a light intensity of a light emitting device and the light emitting device are arranged in adjacent to eachother on one side of a rotary slit disc in such a manner that a portion of the light emitted from the light emitting device which is reflected by the rotary slit disc is sensed by the monitor photosensor to prevent the light intensity emitted by the light emitting device and sensed by the monitor photosensor from being affected by decentering of a periphery of the rotary slit disc due to the rotation of the disc.

Other objects of the present invention will be apparent from detailed description of the preferred embodiments of the present invention taken in conjunction with the accompanying drawings.

BRIEF DESCRIPTION OF THE DRAWINGS

FIGS. 12, 13 and 14 are longitudinal sectional views showing first, second and third embodiments of an optical encoder light source of the present invention as well as light paths.

DETAILED DESCRIPTION OF THE PREFERRED EMBODIMENTS

Figure 1:
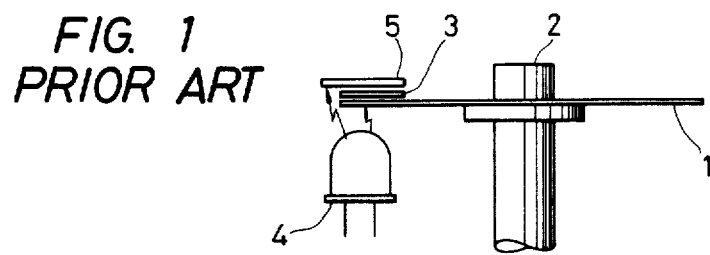
FIG. 1 is a side view of one example of a prior art optical rotary encoder.
Figure 2:
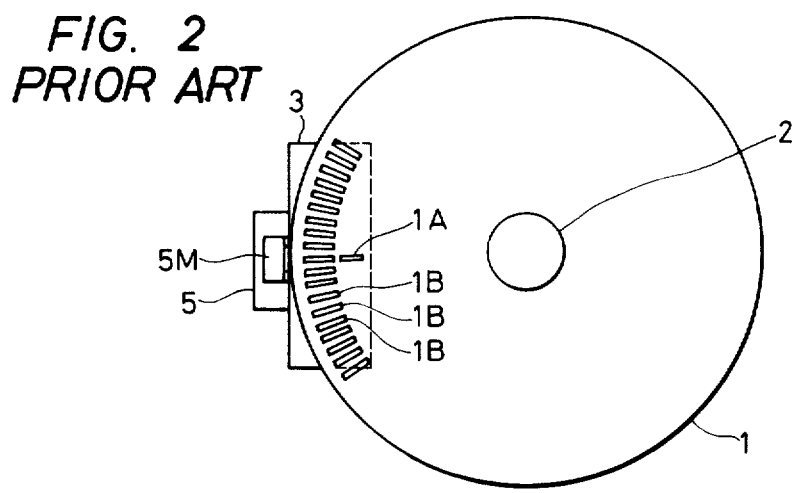
FIG. 2 is a plan view of a slit disc as viewed from a bottom.
Figure 3:
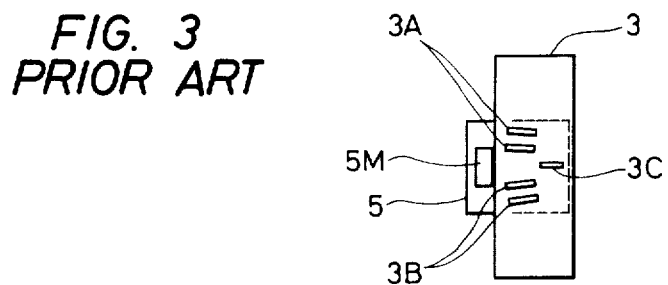
FIG. 3 is a plan view of a stationary slit plate and a photosensor, as viewed from a bottom.
Figure 4:
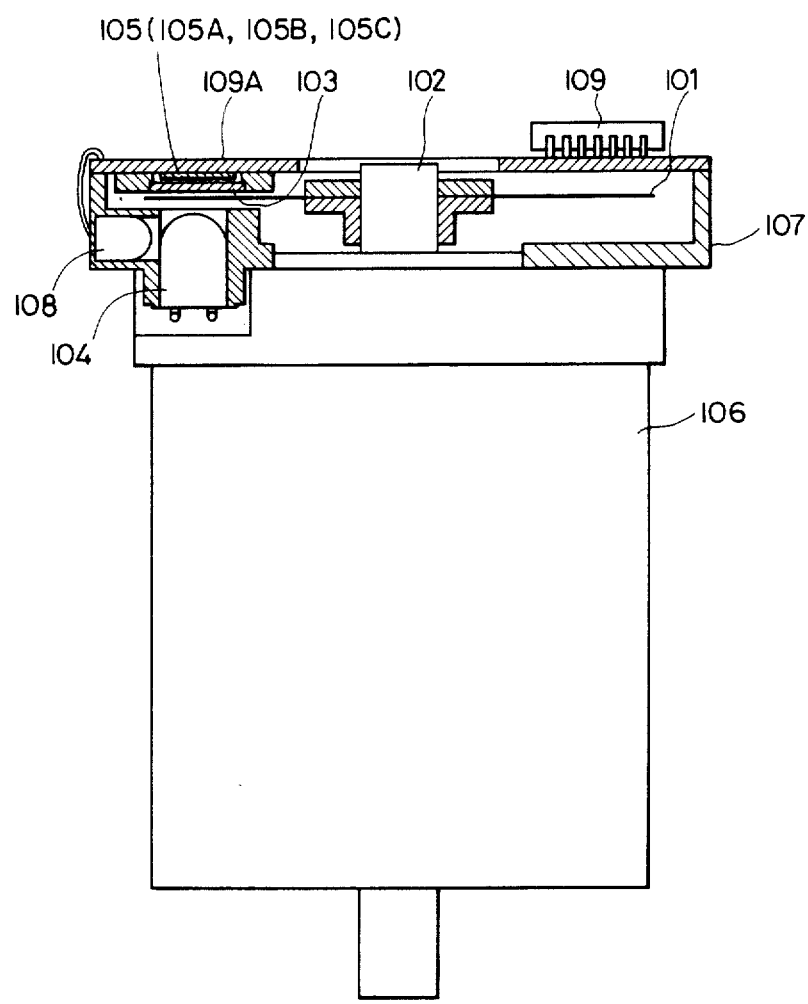
FIG. 4 is a partial sectional view of ne embodiment of a rotary encoder of the present invention.
Figure 5:
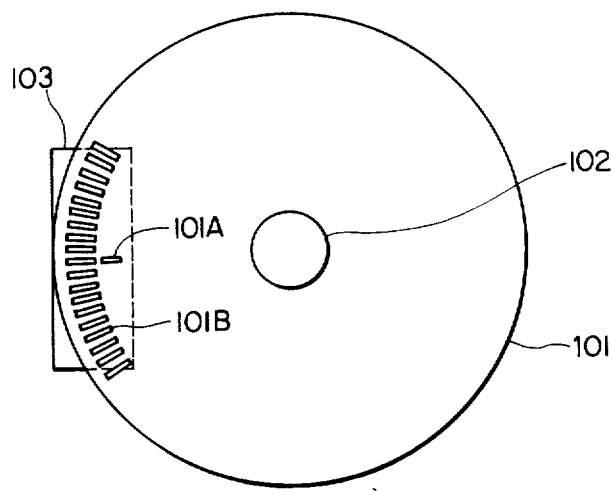
FIG. 5 is a plan view of a slit disc as viewed from a bottom.
Figure 6:
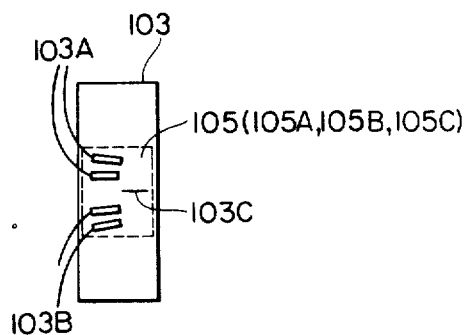
FIG. 6 is a plan view of a stationary slit plate and a photosensor, as viewed from a bottom.

FIGS. 4 to 6 show one embodiment of the present invention. Numeral 106 denotes a rotary machine and numeral 107 denotes an encoder case which is integral with a case of the rotary machine 106, a light emitting device 104 is arranged in the encoder case 107 mounted on a lower side of a rotary slit disc 101 accommodated in the encoder case 107, and a monitoring photosensor 108 is arranged closely to the light emitting device 104 such that it senses only the light emitted from the light emitting device 104.

As the disc 101 is rotated, the light from the light emitting device 104 is sensed by photosensors 105 through a slit 101A of the disc 101 and slits 103A, 103B and 103C of a stationary slit plat 103. In the present embodiment, discrete photosensors 105A, 105B, and 105C (See FIG. 7) are arranged at positions facing the stationary slits 103A, 103B and 103C and they independently sense the lights.

A portion of the light emitted from the light emitting device 104 is directly sensed by the monitoring photosensor 108 which senses a light intensity of the light from the light emitting device 104. Numeral 109 in FIG. 4 denotes a circuit for controlling the light emitting device 104, the photosensors 105A, 105B and 105C and the rotary machine 106 connected to the monitoring photosensor 108, and numeral 109A denotes a double-side printed circuit board having the circuit 109 arranged on an outer surface and the photosensors 105 arranged on an inner surface.

Figure 7:
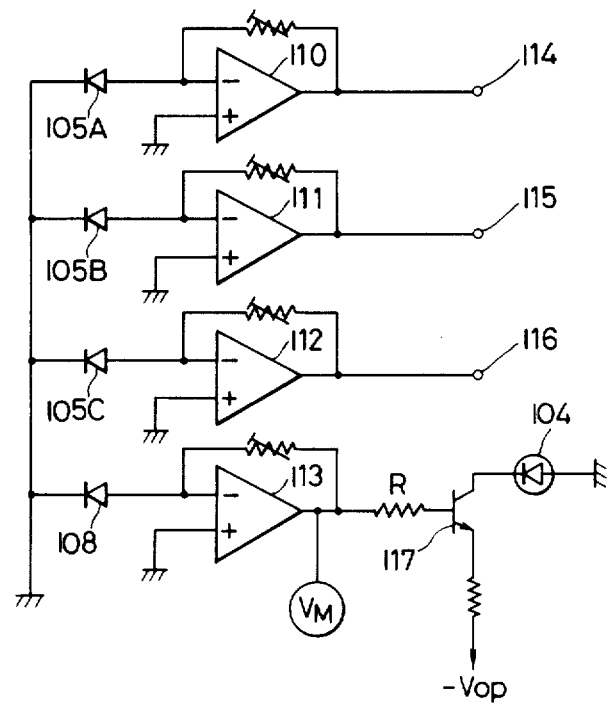
FIG. 7 shows a drive circuit for the rotary encoder of the present invention.

Referring to FIG. 7, an embodiment of the control circuit is shown. In the present embodiment, light signals sensed by the photosensors 105A, 105B and 105C are supplied to negative input terminals of amplifiers 110, 111, and 112, respectively, and the rotary machine 106 is controlled by encoder output signals 114, 115, and 116 produced by the amplifiers 110, 111 and 112.

The light signal sensed by the monitoring photosensor 108 is supplied to a negative input terminal of an amplifier 113 and a current flowing into the light emitting device 104 is controlled by the monitor output signal from the amplifier 113 to regulate the light intensity. To this end, the monitor output from the amplifier 113 is supplied to a base of a transistor 117 through a resistor R.

Since a base potential is kept at a negative potential, the negative potential increases in its absolute value when the light intensity sensed by the monitoring photosensor 108 is high. If a light emitting ability of the light emitting device 104 is lowered and a light output is lowered, the light intensity sensed by the monitoring photosensor 108 decreases and the bse potential rises so that a base-emitter voltage $-V_{op}$ of the transistor 117 increases, the current supplied to the light emitting device 104 increases and the light intensity increases.

If the light emitting ability of the light emitting device 104 is too high, the light intensity sensed by the monitoring photosensor 108 increases, the base potential is lowered and the base-emitter potential $-V_{op}$ is lowered so that the light intensity of the light emitting device 104 is suppressed.

In the above description, a light shield arranged around the monitoring photosensor 108 was not explained. In order for the monitoring photosensor 108 to sense only the light emitted from the light emitting device 104, it is necessary to provide a hood as shown in FIG. 4 around the monitoring photosensor 108 in order to prevent a light reflected by a back side of the disc 101 from being sensed.

In accordance with the present embodiment, the photosensor for monitoring the light intensity to compensate a change in the output of the light emitting device is arranged in adjacent to the light emitting device on one side of the rotary slit disc on which the light emitting device is mounted so that the light from only the light emitting device is sensed. Accordingly, the purpose for compensating the monitoring photosensor is not damaged by the reflected light or scattered light of the light emitting device due to the rotation of the disc and the change in the output of the light emitting device can be precisely compensated, and a reliability of the equipment is enhanced.

Figure 8:
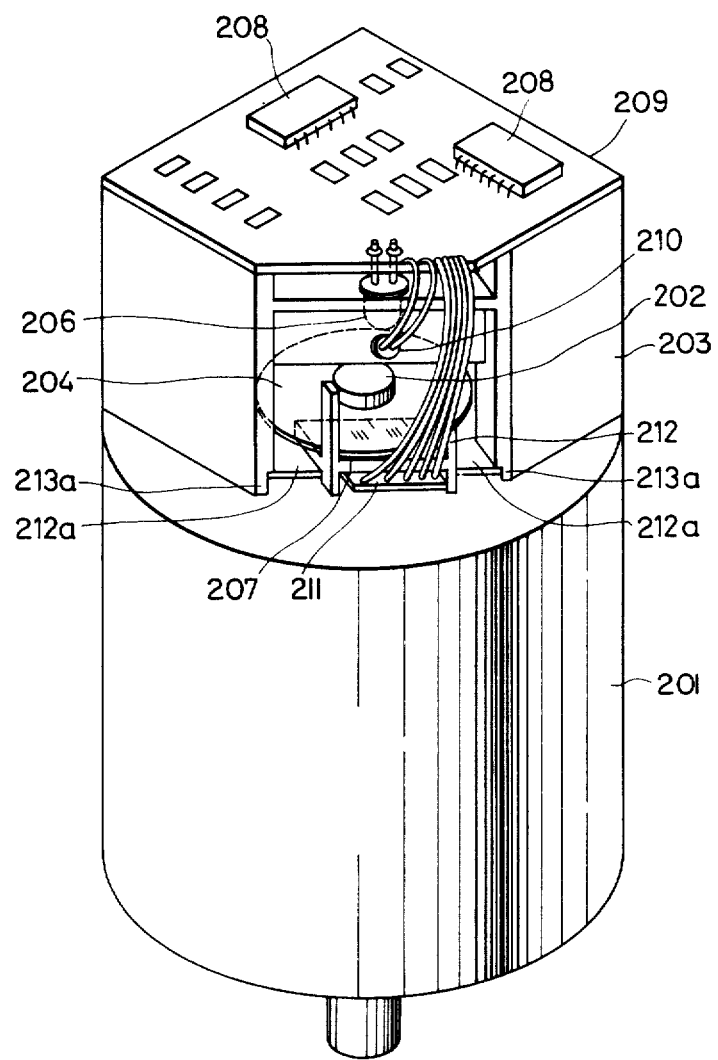
FIG. 8 is a perspective view of a second embodiment which is an improvement over the rotary encoder of FIG. 4.
Figure 9:
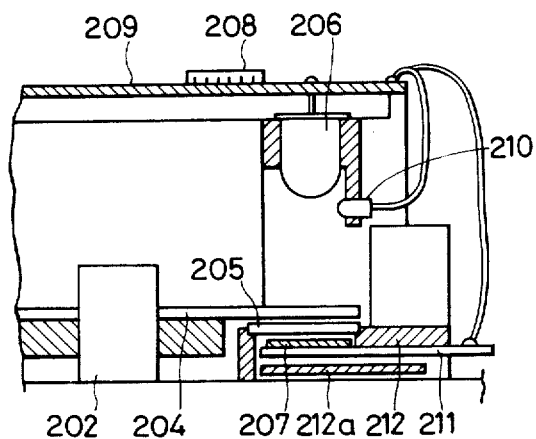
FIG. 9 is a sectional view thereof.
Figure 10:
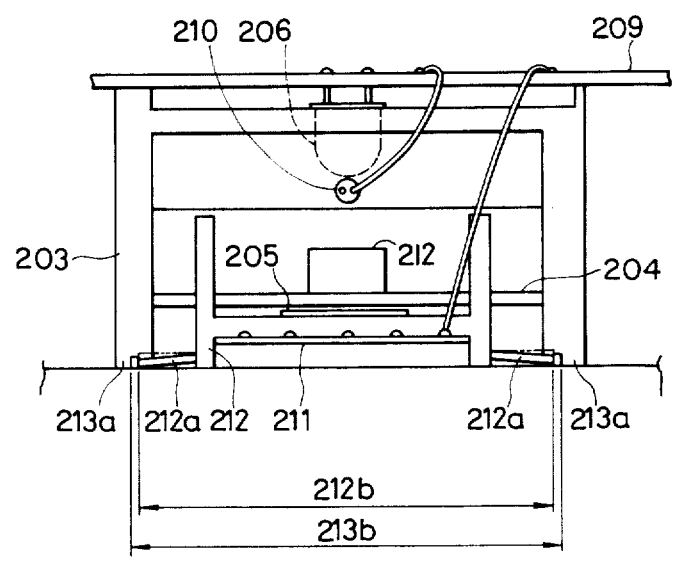
FIG. 10 is a front view thereof.

FIG. 8 is a perspective view of a second embodiment of the present invention which is an improvement over the first embodiment of the encoder, and FIGS. 9 and 10 are a sectional view and a front view thereof.

In the present embodiment, stationary index slits 205 are arranged to face a rotary slit disc 204 fixed to a rotating shaft 202 of a rotary machine 201. A light emitting device 206 is arranged on a printed circuit board 209 so that a light emitted from the light emitting device 206 passes through slits 204A and 205A. A photosensor 207 is mounted on the printed circuit board 211. It senses the transmitted light and converts the light intensity to an electrical signal to produce an output signal.

A monitoring photosensor 210 for compensating for the light output is fixedly mounted in a vicinity of the light emitting device 206 which is fixedly mounted on an encoder case 203. Electrical parts 208 are mounted on the printed circuit board 209 to form a drive circuit for the light emitting device and the photosensors.

An auxiliary printed circuit board 211 and the stationary index slit 205 are fixed to an index holder 212. Cutouts 213a are formed at two points in a plane of the encoder case 213 which contacts to a rotating motor 201. Plate-like resilient members 212a horizontally extend from the opposite sides of the index holder 212. The resilient plate members 212a are slightly flexed and inserted into the cutouts 213a.

Thus, the index holder 212 is always biased toward the motor 201. Accordingly, it does not move in a thrust direction but a relative position in a plane direction of the rotary slit disc 204 and the stationary index slit 205 can be displaced by a distance corresponding to a play between a dimension 213b of the cutouts 213 and a dimension 212b of the index holder 212. Accordingly, the relative position adjustment in the plane direction is facilitated and temporary holding before the index holder 212 is finally fixed by bonding after the adjustment is also facilitated.

Since the dimension in the thrust direction of the index holder 212 can be reduced independently from the dimension of the light emitting device 206, a change in the dimension by a temperature change is reduced even when the index holder 212 is molded. Accordingly, a change in a length of a gap between the rotary slit disc 204 and the stationary index slit 205 by a temperature change can be suppressed and a stable output signal is obtained.

In accordance with the present embodiment, the stationary index slit is arranged on the side of the rotary slit disc facing the rotating motor and the dimension of the index holder in the thrust direction is minimized so that the affect to the output signal by the temperature change of the encoder is reduced and the stable output signal is produced. Further, since the resilient plate members are arranged on the opposite sides of the index holder, the position adjustment and the temporary holding are facilitated and a low cost encoder is provided.

Figure 11:
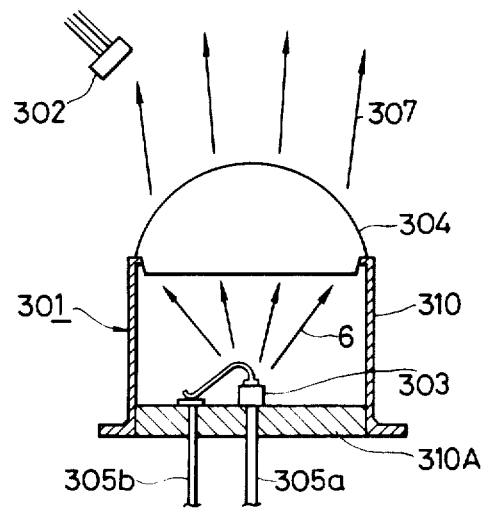
FIG. 11 is a longitudinal view illustrating an arrangement of a light emitting device which is a light source for a prior art optical encoder and a photosensor for monitoring a light intensity, as well as a light path.

FIG. 11 shows a relation between a light emitting device and a light intensity monitoring photosensor in a prior art encoder. The light emitting device 301 and the photosensor 302 are separate parts. A light emitting device 303 is arranged on a bottom plate 310A of a package 310 for the light emitting device 301, and a convex lens 304 is arranged in front of the device in opposing relation to the bottom plate 310A. The light emitting device 303 is arranged on an optical axis of the convex lens 304 and emits light when it is energized through electrodes 305a and 305b. The light emitted from the light emitting device 303 passes through the convex lens 304 and is converged into a directional light 307 as shown by arrows.

Position and angle of the light 307 are detected by photo-electric conversion. It is used as a light source of an optical rotary encoder.

A portion of the directional light 307 is sensed by the photosensor 302 to detect a change in the light intensity of the light emitting device 303 to monitor the light intensity of the light emitting device 303.

Figure 12:
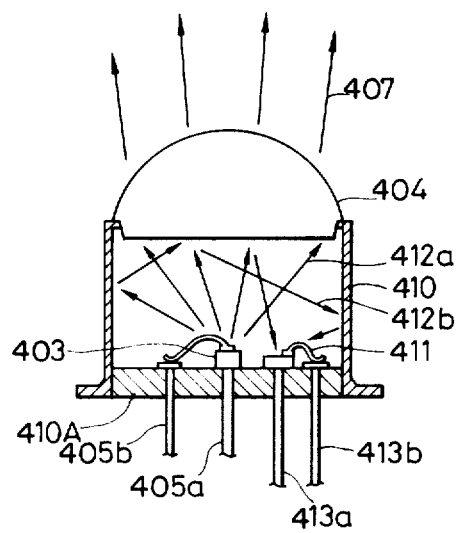

FIG. 12 shows an embodiment of an optical encoder light source of the present invention. A light emitting device 403 and a photosensor 411 are arranged in one package. The light emitting device 403 and the photosensor 411 are arranged on a bottom plate 410A of a package 410 with a light emitting plane and a light receiving plane being in the same direction so that a portion 412b of the light emitted from the light emitting device 403 which is reflected by a lens 404 and a package side wall 410B, not a direct light 412a, is sensed. The monitoring detection signal from the photosensor 411 is taken out of the electrodes 413a and 413b through the bottom plate 410A, and the change in the light intensity of the light emitting device 403 is detected in accordance with the detection signal.

In accordance with the present embodiment, the photosensor 411 for monitoring the light intensity to compensate the change in the light intensity of the light emitting device 403 is mounted in the package 410 of the light emitting device 401. Accordingly, it is not necessary to arrange the light intensity monitoring photosensor externally of the light emitting device 401 and the present light source can be used to detect the position or angle. Since the light is sensed at a very near distance from the light emitting device 403, a sufficient amount of light is supplied to the monitoring photosensor 411.

Since the light emitting device 403 and the photosensor 411 are mounted on the same bottom plate 410A, a manufacturing process is simplified and an inexpensive light source is provided.

FIG. 13 shows other embodiment of the present invention. The photosensor 511 is arranged in the light emitting device package 510 in misalignment with the optical axis of the light emitting device 503. For example, the photosensor 511 is arranged on the side wall 510B of the package 510 in adjacent to the outer periphery of the incident plane of the lens 504 and in opposing relation to the light emitting device 503 so that a portion of the light from the light emitting device 503 which reaches the outer periphery of the lens 504 is sensed as the direct light 512a. The monitoring detection signal from the photosensor 511 is taken out of the electrodes 513a and 513b through the side wall 510B and the change in the light intensity of the light emitting device 503 is detected in accordance with the detection signal.

In the present embodiment, since the light emitting device 503 and the photosensor 511 are opposingly arranged to sense the direct light 512a, the light amount sensed is larger than that in the previous embodiment which utilizes the reflection light in the package 510, and variation of the reflected light due to materials and positions of the lens 504 and the side wall 510B is reduced. Accordinglyl, the variations of the monitor light intensity is further reduced.

FIG. 14 shows other embodiment of the present invention. The light emitting device 603 is arranged on the bottom 610A and the photosensor 611 is arranged in the light emitting device package 610 at a center of the side wall 610A of the package 610 such that the light emitting plane and the light receiving plane have an angle of inclination larger than 0 degree and smaller than 180 degrees. The photosensor 611 can sense both a portion 612a of the direct light from the light emitting devices 603 and a portion 612b of reflected light from the lens 604. The output from the photosensor 611 is taken out of the electrodes 613a and 613b through the side wall 610B as the light intensity monitoring signal of the light emitting device 603, and the change in the light intensity of the light emitting device 603 is detected in accordance with the detection signal.

In accordance with the present embodiment, since both the direct light and the reflected light of the light emitting device 603 are impinged to the light receiving plane of the photosensor 611, the light amount sensed is larger than that in the previous embodiment in which the reflected light in the package 610 is utilized. Further, as compared with the previous embodiment in which the light emitting device 603 and the photosensor 611 are opposingly arranged to sense the direct light, the light path for directing the converging light through the lens 604 is not interrupted by the photosensor 611.

As described above, according to the present embodiment, since the light intensity monitoring photosensor for compensating the change in the light intensity of the light emitting device is assembled in the light emitting device package, it is not necessary to arrange the light intensity monitoring photosensor externally of the light emitting device. Thus the present light source is suitable as a light source for detecting the position or angle. Further, since the photosensor senses the light from the light emitting device at a very near distance, a sufficient amount of light is supplied to the photosensor.

Figure 15:
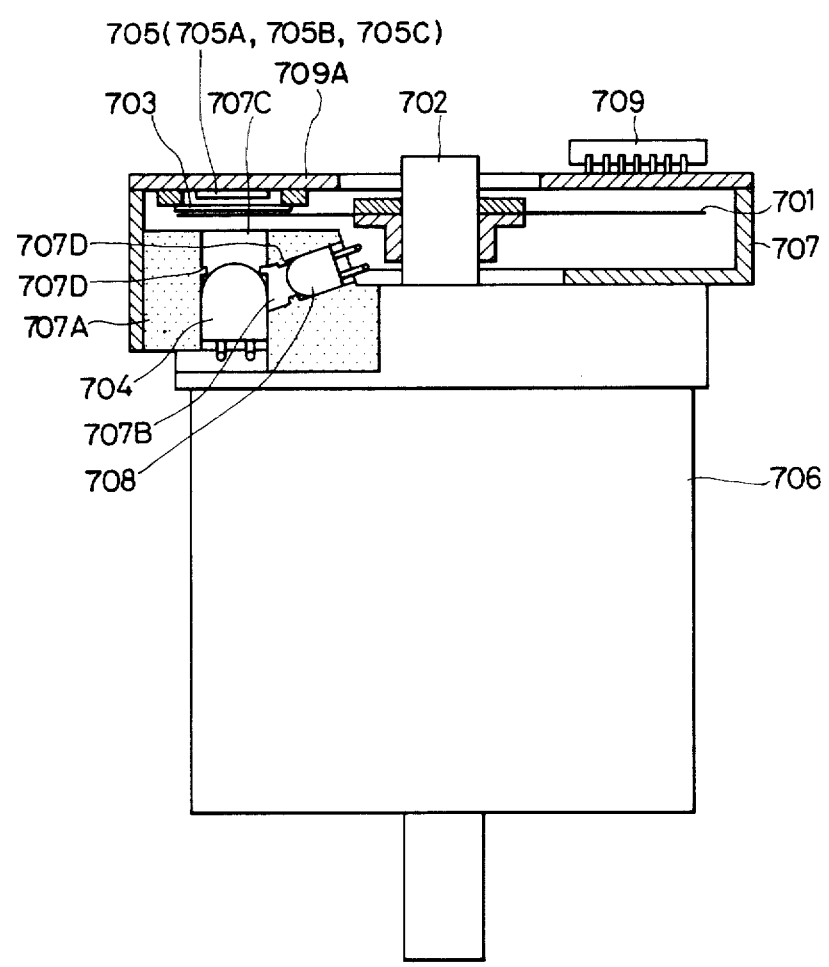
FIG. 15 is a partial sectional view of a third embodiment of the rotary encoder of the present invention.

FIG. 15 shows other embodiment of the present invention. Numeral 706 denotes a rotary machine and numeral 707 denotes an encoder case which is integral with a case of the rotary machine 706. A housing 707A is mounted at a position on the encoder case 707 under a rotary slit disc 701 accommodated in the encoder case 707. A light emitting device 704 is mounted on the housing 707A, and a monitoring photosensor 708 is arranged in the housing 707A in a vicinity of the light emitting device 704 so that the photosensor 708 senses only the light from the light emitting device 704.

In order for the monitoring photosensor 708 senses only the light from the light emitting device 704, a light path 707B for the photosensor 708 formed in the housing 707A is positioned and oriented such that a reflected light from the back side of the disc 701 and external optical noises are interrupted to prevent the reflected light and the optical noises from being introduced into the light path 707B through a light path 707C of the light emitting device 704. The housing 707A is made of non-light transmissible material.

The light paths 707B and 707C have positioning projections 707D to assure more precise positioning of the light emitting device 704 and the monitoring photosensor 708 in the housing 707A and prevent variation of light amount sensed by the monitoring photosensor 708.

In the rotary encoder thus constructed, as the disc 701 is rotated, the light from the light emitting device 704 is sensed by the photosensors 5 through the slit 701A of the disc 701 and the slits 703A, 703B and 703C of the stationary slit plate 703. In the present embodiment, separate photosensors 705A, 705B and 705C are arranged, as shown in FIG. 7, at positions facing the stationary slits 703A, 703B and 703C, respectively, and they independently senses the lights.

A portion of the light emitted by the light emitting device 704 is directly sensed by the monitoring photosensor 708 which detects a light intensity of the light emitting device 704. Numeral 709 shown in FIG. 15 denotes a circuit which controls the light emitting device 704, the photosensors 705A, 705B and 705C and the monitoring photosensor 708 to control the rotary machine 706, and numeral 709A denotes a doubleside printed circuit board having the photosensors 705 arranged on an inner surface and the circuit 709 arranged on an outer surface.

Referring to FIG. 7, an embodiment of the control circuit is shown. In the present embodiment, light signals sensed by the photosensors 105A, 105B and 105C are supplied to negative input terminals of amplifiers 110, 111 and 112, respectively, and the rotary machine 106 is controlled by encoder output signals 114, 115 and 116 produced by the amplifiers 110, 111 and 112.

The light signal sensed by the monitoring photosensor 108 is supplied to a negative input terminal of an amplifier 113 and a current flowing into the light emitting device 104 is controlled by the monitor output signal from the amplifier 113 to regulate the light intensity. To this end, the monitor output from the amplifier 113 is supplied to a base of a transistor 117 through a resistor R.

Since a base potential is kept at a negative potential, the negative potential increases in its absolute value when the light intensity sensed by the monitoring photosensor 108 is high. If a light emitting ability of the light emitting device 104 is lowered and a light output is lowered, the light intensity sensed by the monitoring photosensor 108 decreases and the base potential rises so that a base-emitter voltage $-V_{op}$ of the transistor 117 increases, the current supplied to the light emitting device 104 increases and the light intensity increases.

If the light emitting ability of the light emitting device 104 is too high, the light intensity sensed by the monitoring photosensor 108 increases, the base potential is lowered and the base-emitter potential $-V_{op}$ is lowered so that the light intensity of the light emitting device 104 is suppressed.

In accordance with the present embodiment, the container for accommodating the light emitting device and the monitoring photosensor for compensating the change in the light output of the light emitting device, in adjacent to each other, is mounted on one side of the rotary slit disc, and the light path is established in the container such that only the light from the light emitting device is directly sensed by the monitoring photosensor. Accordingly, the purpose of compensation of the monitoring photosensor is not damaged by the reflected light or scattered light from the light emitting device generated by the rotation of the disc, or the external optical noise. Further, since the light emitting device and the monitoring photosensor are mounted at the predetermined positions in the container, adjustment for compensating mismatching of positions and directions of those parts is not necessary and the assembly work is simplified.

Figure 16:
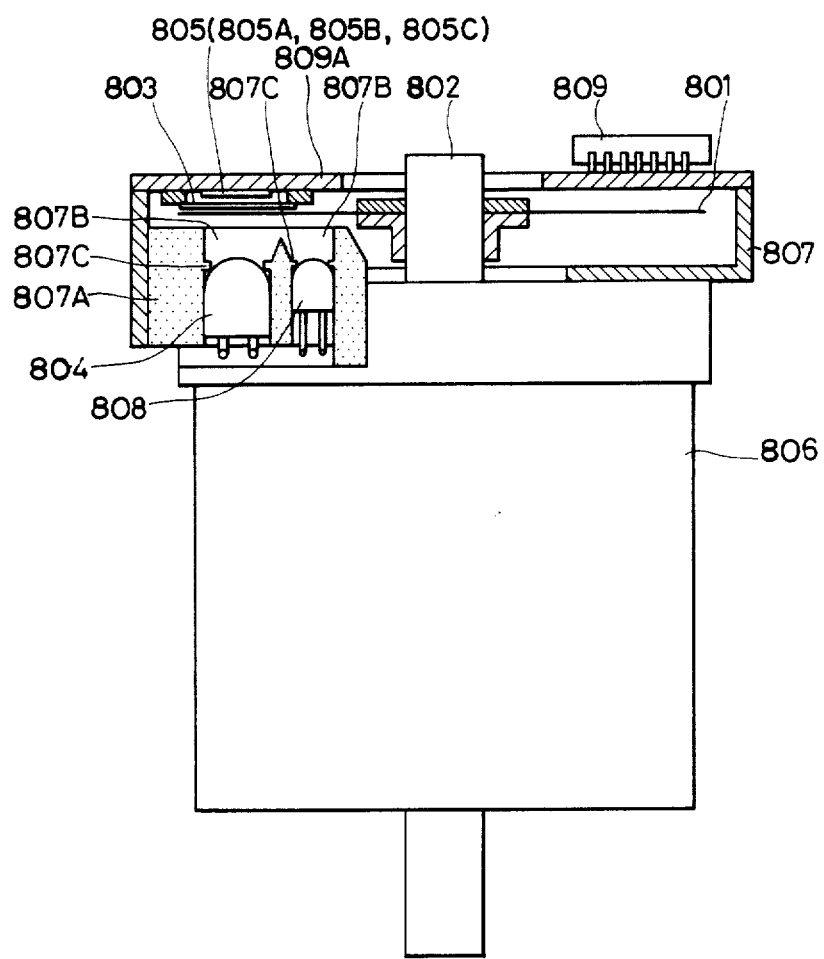
FIG. 16 is a partial sectional view of a fourth embodiment of the rotary encoder of the present invention.

FIG. 16 shows other embodiment of the present invention. Numeral 806 denotes a rotary machine and numeral 807 denotes an encoder case which is integral with a case of the rotary machine 806. A rotary slit disc 801 is accommodated in the encoder case 807. The disc 801 may be made of a glass mirrored with a vapor-deposited metal. A housing 807A is fixed to the case under the disc 801. The light emitting device 804 and the monitoring photosensor 808 are substantially parallelly arranged in the housing 807A.

The monitoring photosensor 805 is arranged inside of the light emitting device 804 at a position closer to the rotating shaft 802 so that it senses only the reflected light from the disc 801. Further, a light path 807B is formed in the housing 807A to allow the sensing of only the reflected light.

In order to prevent the external optical noise from entering into the monitoring photosensor 808, it is preferable to arrange the photosensor 808 inside as seen from the shape of the disc 801 shown in FIG. 5, because the glared metal vapordeposition film on the back side of the disc 801 can be used as the reflection surface. Further, with this arrangement, the waving of the disc surface due to insufficient planarity of the disc 1 is reduced and the affect to the light amount sensed can be suppressed.

Numeral 807C denotes a positioning member projecting from the periphery of the light path 807B. By the arrangement of the positioning member, the light emitting device 804 and the monitoring photosensor 808 can be more precisely positioned in the housing 807A.

The housing 807A has the light path 807B of hood type as shown in FIG. 16 and is made of nonlight transmissible material.

In the rotary encoder thus constructed, as the disc 1 is rotated, the light from the light emitting device 804 is sensed by the photosensors 805 through the slits 801A and 801B of the disc 801 and the slits 803A, 803B and 803C of the stationary slit plate 803. In the present embodiment, separate photosensors 805A, 805B and 805C are arranged at positions facing the stationary slits 803A, 803B and 803C as shown in FIG. 7 and they independently sense the lights.

A portion of the light from the light emitting device 804 which is reflected by the back surface of the disc 801 is sensed by the monitoring photosensor 808 which detects a light intensity of the light emitting device 804. Numeral 809 in FIG. 16 denotes a circuit connected to the light emitting device 804 and the photosensors 805A, 805B and 805C and the monitoring photosensor 8 to control the rotary machine 806, and numeral 809A denotes a doubleside printed circuit board having the circuit 809 arranged on an outer surface and the photosensors 805 arranged on an inner surface.

The metal film (not shown) vapor-deposited on the rotary slit disc 801 is usually a chrome or aluminum film which has a high reflection coefficient. Accordingly, a sufficient amount of light is obtained by the reflection light. When the disc is made of glass, the surface is highly polished and has a high planar precision and no diffused reflection occurs. Waving of the surface of the disc 801 should be minimized in order to maintain the stability of the encoder output signal. The light intensity of the light emitting device 804 can be precisely detected by the reflection light, as is apparent from the above conditions.

In accordance with the present embodiment, the monitoring photosensor for sensing the light intensity to compensate the change in the output of the light emitting device and the light emitting device are arranged in adjacent to each other on one side of the rotary slit disc in such a manner that the monitoring photosensor is closer to the rotation center of the disc than the light emitting device and the monitoring photosensor senses only the portion of the light from the light emitting device which is reflected by the rotary slit disc. Accordingly, the change in the light intensity of the reflection light sensed by the monitoring photosensor due to the external optical noise or the waving of the center or the surface of the disc is significantly reduced as compared with the prior art. Thus, the compensation function of the monitoring photosensor is fully attained.

The light emitting device and the monitoring photosensor are accommodated in the positioning container which is fixed to the encoder case and the light path is formed in the container such that only the reflection light from the disc is sensed. If the light emitting device and the monitoring photosensor are separately mounted on the case, variations occur in the relative position and orientation of those parts and adjustment work is required. The present embodiment does not require such adjustment and a stable compensation function of the monitoring photosensor is provided.

Figure 17:
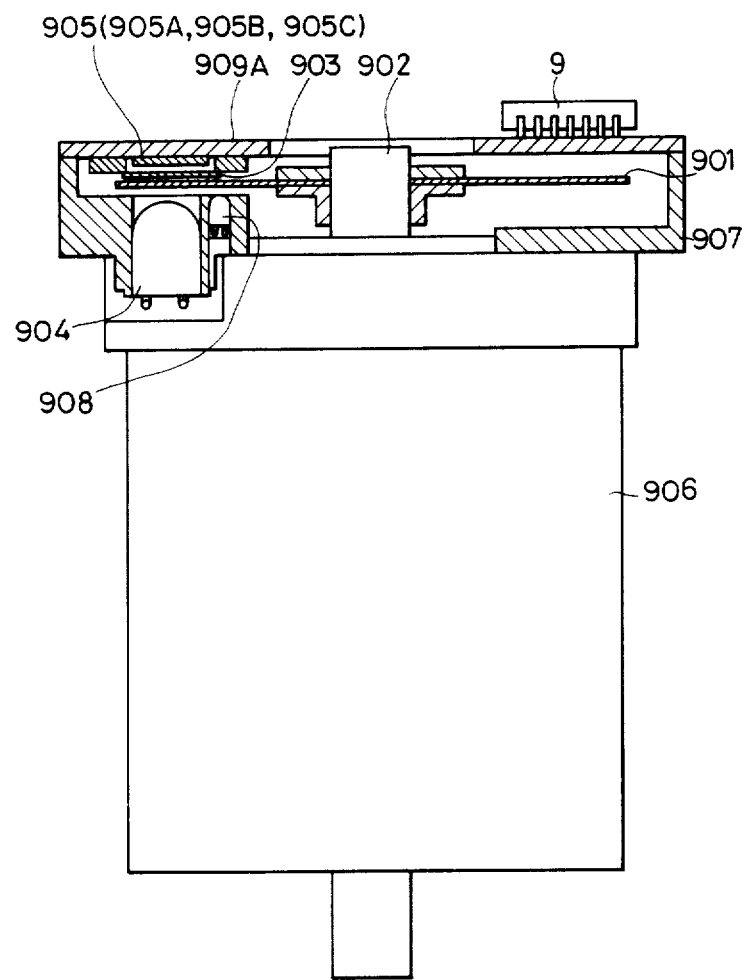
FIG. 17 is a partial sectional view of a fifth embodiment which is an improvement over the rotary encoder of FIG. 15.

FIG. 17 shows other embodiment which is an improvement over the rotary encoder of the present invention shown in FIG. 15. Numeral 906 denotes a rotary machine and numeral 907 denotes an encoder case which is integral with a case of the rotary machine 906. A light emitting device 904 is mounted in the encoder case 907 under a rotary slit disc 901 accommodated in the encoder case 907, and a monitoring photosensor 908 for sensing only a portion of the light from the light emitting device 904 which is reflected by the disc 901 is arranged at a position closer to a rotating shaft 902 than the light emitting device 904.

As the disc 901 is rotated, the light from the light emitting device 904 is sensed by the photosensors 905 through the slit 901A of the disc 901 and the slits 903A, 903B and 903C of the stationary slit plate 903. In the present embodiment, separate photosensors 905A, 905B and 905C are arranged at positions facing the stationary slits 903A, 903B and 903C as shown in FIG. 7 and they independently sense the lights.

A portion of the light from the light emitting device 904 which is reflected by the back surface of the disc 901 is sensed by the monitoring photosensor 908 which detects the light intensity of the light emitting device 904. Numeral 909 in FIG. 17 denotes a circuit connected to the light emitting device 904 and the photosensors 905A, 905B and 905C and the monitoring photosensor 908 to control the rotary machine 906, and numeral 909A denotes a double-side printed circuit board having the circuit 909 arranged on an outer surface and the photosensors 905 arranged on an inner surface.

The metal film (not shown) vapor-deposited on the rotary slit disc 901 is usually a chrome or alluminum film which has a high reflection coefficient. Accordingly, a sufficient amount of light is obtained by the reflection light. When the disc is made of glass, the surface is highly polished and has a high planar precision and no diffused reflection occurs. Waving of the surface of the disc 901 should be minimized in order to maintain the stability of the encoder output signal. The light intensity of the light emitting device 904 can be precisely detected by the reflection light, as is apparent from the above conditions.

In accordance with the present embodiment, the monitoring photosensor for sensing the light intensity to compensate the change in the output of the light emitting device and the light emitting device are arranged in adjacent to each other on one side of the rotary slit disc in such a manner that the monitoring photosensor is closer to the rotation center of the disc than the light emitting device and the monitoring photosensor senses only the portion of the light from the light emitting device which is reflected by the rotary slit disc. Accordingly, the change in the light intensity of the light emitting device can be compensated by the monitoring photosensor without being affected by the center waving at the periphery of the rotating slit disc and a proper light intensity of the light emitting device is always maintained. Thus, a highly reliable rotary encoder is provided.

What is claimed is:

1. A rotary encoder comprising:
   a light emitting device
   a photosensor;
   sampling means disposed between said light emitting device and said photosensor for intercepting light from said light emitting device as said sampling means is rotated;
   monitoring means disposed on a side of said sampling means adjacent to said light emitting device for sensing a portion of the light from said light emitting device to produce a signal representing a light intensity sensed; and
   means for controlling the light intensity of said light emitting device in accordance with an output from said monitoring means.

2. A rotary encoder comprising:
   a light emitting divice;
   a first photosensor;
   slit means disposed between said light emitting device and said first photosensor;
   rotation means for rotating said slit means, said rotation means disposed on the same side of said slit means as said first photosensor;
   stationary slit means disposed between said slit means and said first photosensor; and
   a second photosensor arranged on the same side of said slit means as said light emitting device, wherein said second photosensor is adapted to monitor the light intensity of said light emitting device.

3. A rotary encoder according to claim 2, further comprising a support member on which said first photosensor and said stationary slit means are mounted, wherein said support member is disposed on the same side of said slit means as said rotation means, wherein said support member comprises resilient members arranged on the opposite sides of said support member, said resilient member being fixed to said apparatus by a slight deformation thereof.

4. A rotary encoder according to claim 2, wherein said light emitting device and said second photosensor are arranged in a common housing.

5. A rotary encoder according to claim 4, wherein said slit means comprises a substrate composed of mirrored glass.

6. A rotary encoder according to claim 2, further comprising:
   a printed circuit board having said first photosensor arranged thereon.

* * * * *

UNITED STATES PATENT AND TRADEMARK OFFICE
CERTIFICATE OF CORRECTION

PATENT NO. : 4,712,000    Page 1 of 3
DATED : December 8, 1987
INVENTOR(S) : JUNICHI YOSHIKAWA, ET AL.

It is certified that error appears in the above-identified patent and that said Letters Patent is hereby corrected as shown below:

COLUMN 1

Line 34, "whichis" should read --which is--.
    Line 54, "vapordepositing" should read
        --vapor-depositing--.

COLUMN 2

Line 56, "light accordingly," should read
        --light. Accordingly,--.
    Line 57, "sealed" should read --seal--.
    Line 67, "disk" should read --disc--.

COLUMN 3

Line 8, "rortary" should read --rotary--.
    Line 14, "other" should read --another--.
    Line 21, "other" should read --another--.
    Line 33, "other" should read --another--.
    Line 46, "other" should read --another--.
    Line 49, ""in" should be deleted.
    Line 50, "eachother" should read --each other--.
    Line 60, "from" should read --from a--.

UNITED STATES PATENT AND TRADEMARK OFFICE
CERTIFICATE OF CORRECTION

PATENT NO. : 4,712,000

DATED : December 8, 1987

INVENTOR(S) : JUNICHI YOSHIKAWA, ET AL.

It is certified that error appears in the above-identified patent and that said Letters Patent is hereby corrected as shown below:

OLUMN 4

Line 3, "ne" should read --one--.
    Line 48, "plat" should read --plate--.

OLUMN 5

Line 17, "bse" should read --base--.
    Line 38, "in adjacent" should read --adjacent--.

OLUMN 7

Line 43, "Accordinglyl," should read --Accordingly,--.
    Line 45, "other" should read --another--.
    Line 47, "bottom 610A" should read --bottom plate 610A--.
    Line 49, "side wall 610A" should read --side wall 610B--.

OLUMN 8

Line 15, "other" should read --another--.
    Line 26, "senses" should read --to sense--.
    Line 44, "photosensors 5" should read --photosensors 705--.
    Line 50, "senses" should read --sense--.

UNITED STATES PATENT AND TRADEMARK OFFICE
CERTIFICATE OF CORRECTION

PATENT NO. : 4,712,000

DATED : December 8, 1987

INVENTOR(S) : JUNICHI YOSHIKAWA, ET AL.

It is certified that error appears in the above-identified patent and that said Letters Patent is hereby corrected as shown below:

COLUMN 9

Line 43, "other" should read --another--.
    Line 53, "805" should read --808--.
    Line 63, "vapordeposition" should read --vapor-deposition--.

COLUMN 10

Line 24, "8" should read --808--.

COLUMN 11

Line 1, "other" should read --another--.
    Line 34, "alluminum" should read --aluminum--.

COLUMN 12

Line 23, "divice" should read --device--.

Signed and Sealed this

Twenty-first Day of June, 1988

Attest:

DONALD J. QUIGG

Attesting Officer      Commissioner of Patents and Trademarks